United States Patent
Eldridge et al.

(10) Patent No.: US 6,184,053 B1
(45) Date of Patent: Feb. 6, 2001

(54) METHOD OF MAKING MICROELECTRONIC SPRING CONTACT ELEMENTS

(75) Inventors: Benjamin N. Eldridge, Danville; Igor Y. Khandros, Orinda; Gaetan L. Mathieu, Livermore; David V. Pedersen, Scotts Valley, all of CA (US)

(73) Assignee: FormFactor, Inc., Livermore, CA (US)

( * ) Notice: Under 35 U.S.C. 154(b), the term of this patent shall be extended for 0 days.

(21) Appl. No.: 08/852,152

(22) Filed: May 6, 1997

Related U.S. Application Data

(63) Continuation-in-part of application No. 08/452,255, filed on May 26, 1995, now abandoned, and a continuation-in-part of application No. PCT/US95/14909, filed on Nov. 13, 1995, which is a continuation-in-part of application No. 08/340,144, filed on Nov. 15, 1994, now Pat. No. 5,917,707, and a continuation-in-part of application No. PCT/US94/13373, filed on Nov. 16, 1994, which is a continuation-in-part of application No. 08/152,812, filed on Nov. 16, 1993, now Pat. No. 5,476,211, which is a continuation-in-part of application No. 08/554,902, filed on Nov. 9, 1995, now Pat. No. 5,974,662, and a continuation-in-part of application No. PCT/US95/14844, filed on Nov. 13, 1995, and a continuation-in-part of application No. 08/558,332, filed on Nov. 15, 1995, now Pat. No. 5,829,128, and a continuation-in-part of application No. PCT/US95/14885, filed on Nov. 15, 1995, and a continuation-in-part of application No. PCT/US96/08117, filed on May 24, 1996, and a continuation-in-part of application No. PCT/US96/08107, filed on May 24, 1996, and a continuation-in-part of application No. 08/784,862, filed on Jan. 15, 1997, and a continuation-in-part of application No. 08/802,054, filed on Feb. 18, 1997, and a continuation-in-part of application No. 08/819,464, filed on Mar. 17, 1997

(60) Provisional application No. 60/030,697, filed on Nov. 13, 1996, provisional application No. 60/012,027, filed on Feb. 21, 1996, provisional application No. 60/005,189, filed on May 17, 1996, and provisional application No. 60/024,555, filed on Aug. 26, 1996.

(51) Int. Cl.[7] .................................................. H01L 21/44

(52) U.S. Cl. ............................................... 438/52; 438/117

(58) Field of Search ..................................... 438/825, 117, 438/17, 15, 617, 619, 637, 641, 52; 439/81; 257/784, 781; 29/842, 854; 361/776

(56) References Cited

U.S. PATENT DOCUMENTS

| 5,059,556 | * 10/1991 | Wilcoxen | 438/619 |
| 5,164,334 | * 11/1992 | Gimpelson | 438/619 |

(List continued on next page.)

FOREIGN PATENT DOCUMENTS

| 0457253 | 11/1991 | (EP) | G01B/7/34 |
| WO95/14314 | 5/1995 | (WO) | H01R/9/00 |

OTHER PUBLICATIONS

Active Substrate Membrane Probe Card, Leung et al. Oct. 1995, 4 pages XP000624791.

* cited by examiner

*Primary Examiner*—Savitri Mulpuri
(74) *Attorney, Agent, or Firm*—Gerald E. Linden; David Larwood

(57) ABSTRACT

Spring contact elements are fabricated by depositing at least one layer of metallic material into openings defined in masking layers deposited on a surface of a substrate which may be an electronic component such as an active semiconductor device. Each spring contact element has a base end, a contact end, and a central body portion. The contact end is offset in the z-axis (at a different height) and in at least one of the x and y directions from the base end. In this manner, a plurality of spring contact elements are fabricated in a prescribed spatial relationship with one another on the substrate. The spring contact elements make temporary (i.e., pressure) or permanent (e.g., joined by soldering or brazing or with a conductive adhesive) connections with terminals of another electronic component to effect electrical connections therebetween. In an exemplary application, the spring contact elements are disposed on a semiconductor devices resident on a semiconductor wafer so that temporary connections can be made with the semiconductor devices to burn-in and/or test the semiconductor devices.

21 Claims, 5 Drawing Sheets

U.S. PATENT DOCUMENTS

| | | | |
|---|---|---|---|
| 5,326,726 | * 7/1994 | Tsang et al. | 438/619 |
| 5,391,521 | 2/1995 | Kim | 437/200 |
| 5,475,318 | 12/1995 | Marcus et al. | 324/762 |
| 5,476,211 | * 12/1995 | Khandros | 228/180.5 |
| 5,495,667 | * 3/1996 | Farnworth et al. | 438/117 |
| 5,595,942 | * 1/1997 | Albrecht et al. | 438/52 |
| 5,731,229 | * 3/1998 | Kato et al. | 438/52 |
| 5,756,370 | * 5/1998 | Farnworth et al. | 438/15 |
| 5,777,328 | * 7/1998 | Gooch | 250/338 X |
| 5,789,264 | * 8/1998 | Chung | 438/52 |
| 5,879,963 | * 3/1999 | Howe et al. | 438/619 |
| 5,897,326 | * 6/1999 | Eldrige et al. | 438/117 |
| 5,917,707 | * 6/1999 | Khandros et al. | 29/854 |
| 5,930,596 | * 7/1999 | Klose et al. | 438/98 |

METHOD OF MAKING MICROELECTRONIC SPRING CONTACT ELEMENTS

CROSS-REFERENCE TO RELATED APPLICATIONS

This patent application is a continuation-in-part of commonly-owned, copending U.S. patent application Ser. No. 60/030,697 filed Nov. 13, 1996, which is incorporated by reference herein.

This patent application is also a continuation-in-part of commonly-owned, U.S. patent application Ser. No. 08/452,255 (hereinafter "PARENT CASE") filed May 26, 1995, now abandoned and its counterpart PCT patent application number PCT/US95/14909 filed Nov. 13, 1995, both of which are continuations-in-part of commonly-owned, U.S. patent application Ser. No. 08/340,144 filed Nov. 15, 1994 U.S. Pat. No. 5,917,707 and its counterpart PCT patent application number PCT/US94/13373 filed Nov. 16, 1994, both of which are continuations-in-part of commonly-owned, U.S. patent application Ser. No. 08/152,812 filed Nov. 16, 1993 (now U.S. Pat. No. 5,476,211, Dec. 19, 1995), all of which are incorporated by reference herein.

This patent application is also a continuation-in-part of the following commonly-owned, copending U.S. patent application Ser. Nos.:

Ser. No. 08/554,902 filed Nov. 09, 1995 now U.S. Pat. No. 5,974,602 (PCT/US95/14844, Nov. 13, 1995);

Ser. No. 08/558,332 filed Nov. 15, 1995 U.S. Pat. No. 5,829,128 (PCT/US95/14885, Nov. 15, 1995);

Ser. No. 60/012,027 filed Feb. 21, 1996 (PCT/US96/08117, May 24, 1996);

Ser. No. 60/005,189 filed May 17, 1996 (PCT/US96/08107, May 24, 1996);

Ser. No. 60/024,555 filed Aug. 26, 1996;

Ser. No. 08/784,862 filed Jan. 15, 1997; pending

Ser. No. 08/802,054 filed Feb. 18, 1997; and pending

Ser. No. 08/819,464 filed Mar. 17, 1997, pending all of which (other than the provisional patent applications) are continuations-in-part of the aforementioned PARENT CASE, and all of which are pending and incorporated by reference herein.

TECHNICAL FIELD OF THE INVENTION

The present invention relates to resilient (spring) contact (interconnection) elements (structures) suitable for effecting pressure and/or compliant connections between electronic components and, more particularly, to microminiature spring contact elements.

BACKGROUND OF THE INVENTION

Commonly-owned U.S. patent application Ser. No. 08/152,812 filed Nov. 16, 1993 (now U.S. Pat. No. 4,576,211, issued Dec. 19, 1995), and its counterpart commonly-owned copending "divisional" U.S. patent applications Ser. Nos. 08/457,479 filed Jun. 1, 1995 (U.S. Pat. No. 6,049,976) and Ser. No. 08/570,230 filed Dec. 11, 1995 (U.S. Pat. No. 5,852,871), all by KHANDROS, disclose methods for making resilient interconnection elements for microelectronics applications involving mounting an end of a flexible elongate core element (e.g., wire "stem" or "skeleton") to a terminal on an electronic component, coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Commonly-owned, copending U.S. patent application Ser. No. 08/340,144 filed Nov. 15, 1994, U.S. Pat. No. 5,917,707 and its corresponding PCT patent application No. PCT/US94/13373 filed Nov. 16, 1994 (WO95/14314, published May 26, 1995), both by KHANDROS and MATHIEU, disclose a number of applications for the aforementioned spring contact element, and also discloses techniques for fabricating contact pads at the ends of the spring contact elements. For example, in FIG. 14 thereof, a plurality of negative projections or holes, which may be in the form of inverted pyramids ending in apexes, are formed in the surface of a sacrificial layer (substrate). These holes are then filled with a contact structure comprising layers of material such as gold or rhodium and nickel. A flexible elongate element is mounted to the resulting contact structure and can be overcoated in the manner described hereinabove. In a final step, the sacrificial substrate is removed. The resulting spring contact has a contact pad having controlled geometry (e.g., sharp points) at its free end.

Commonly-owned, copending U.S. patent application Ser. No. 08/452,255 filed May 26, 1995 pending and its corresponding PCT patent application No. PCT/US95/14909 filed Nov. 13, 1995 (WO96/17278, published Jun. 6, 1996), both by ELDRIDGE, GRUBE, KHANDROS and MATHIEU, disclose additional techniques and metallurgies for fabricating contact tip structures on sacrificial substrates, as well as techniques for transferring a plurality of spring contact elements mounted thereto, en masse, to terminals of an electronic component (see, e.g., FIGS. 11A–11F and 12A–12C therein).

Commonly-owned, copending U.S. Provisional Patent Application No. 60/005,189 filed May 17, 1996 and its corresponding PCT patent application No. PCT/US96/08107 filed May 24, 1996 (WO096/37332, published Nov. 28, 1996), both by ELDRIDGE, KHANDROS, and MATHIEU, discloses techniques whereby a plurality of contact tip structures (see, e.g, #620 in FIG. 6B therein) are joined to a corresponding plurality of elongate contact elements (see, e.g., #632 of FIG. 6D therein) which are already mounted to an electronic component (#630). This patent application also discloses, for example in FIGS. 7A–7E therein, techniques for fabricating "elongate" contact tip structures in the form of cantilevers. The cantilever tip structures can be tapered, between one end thereof and an opposite end thereof. The cantilever tip structures of this patent application are suitable for mounting to already-existing (i.e., previously fabricated) raised interconnection elements (see, e.g., #730 in FIG. 7F) extending (e.g., free-standing) from corresponding terminals of an electronic component (see. e.g., #734 in FIG. 7F).

Commonly-owned, copending U.S. Provisional Patent Application No. 60/024,555 filed Aug. 26, 1996, by ELDRIDGE, KHANDROS and MATHIEU, discloses, for example at FIGS. 2A–2C thereof, a technique whereby a plurality of elongate tip structures having different lengths than one another can be arranged so that their outer ends are disposed at a greater pitch than their inner ends. Their inner, "contact" ends may be collinear with one another, for effecting connections to electronic components having terminals disposed along a line, such as a centerline of the component.

The present invention addresses and is particularly well-suited to making interconnections to modern microelectronic devices having their terminals (bond pads) disposed at a fine-pitch. As used herein, the term "fine-pitch" refers to microelectronic devices that have their terminals disposed at a spacing of less than 5 mils, such as 2.5 mils or 65 µm. As will be evident from the description that follows, this is preferably achieved by taking advantage of the close tolerances that readily can be realized by using lithographic rather than mechanical techniques to fabricate the contact elements.

SUMMARY OF THE INVENTION

An object of the present invention is to provide an improved technique for fabricating spring contact elements.

Another object of the invention is to provide a technique for fabricating spring contact elements using processes that are inherently well-suited to the fine-pitch close-tolerance world of microelectronics.

Another object of the invention is to provide a technique for fabricating microminiature spring contact elements directly on active electronic components, such as semiconductor devices, without damaging the semiconductor devices. This includes fabricating microminiature spring contact elements on semiconductor devices resident on a semiconductor wafer, prior to their being singulated therefrom.

Another object of the invention is to provide a technique for fabricating spring contact elements that are suitable for socketing (releasably connecting to) electronic components such as semiconductor devices, such as for performing burn-in on said devices.

According to the invention, a spring contact element is fabricated on an electronic component such as an active semiconductor device by photolithographically defining one or more openings in corresponding one or more masking layers, depositing a conductive metallic mass in the three-dimensional opening(s), then removing the masking layer (s), resulting in a spring contact element which has a base (proximal) end which is adjacent a surface of the component and a contact (distal) end (also "tip end" or "free end") which is both horizontally and vertically spaced apart from the base end. A plurality of spring contact elements can be fabricated in this manner on the component, to photolithographic (extremely fine) tolerances.

The spring contact elements of this invention are suitable for making either temporary or permanent electrical connections to terminals of another electronic component such as a printed circuit board (PCB).

For making temporary connections, the component upon which the spring contact elements are fabricated is brought together with another electronic component so that the tip ends of the spring contact elements are in pressure contact with terminals of the other electronic component. The spring contact elements react resiliently to maintain contact pressure and electrical connections between the two components.

For making permanent connections, the component upon which the spring contact elements are fabricated is brought together with another electronic component, and the tip ends of the spring contact elements are joined, such as by soldering or brazing or with a conductive adhesive, to terminals of the other electronic component. The spring contact elements are compliant, and accommodate differential thermal expansion between the two electronic components.

The spring contact element is suitably formed of at least one layer of a metallic material selected for its ability to cause the resulting contact structure to function, in use, as a spring (i.e., exhibit elastic deformation) when force is applied to its contact (free) end.

The spring contact elements of the present invention can be fabricated directly on the surface of a semiconductor device, or on the surfaces of a plurality of semiconductor devices resident on a semiconductor wafer. In this manner, a plurality of semiconductor devices resident on a semiconductor wafer can be "readied" for burn-in and/or test prior to being singulated from the semiconductor wafer.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199*a,* 199*b,* 199*c,* etc.

DETAILED DESCRIPTION OF THE INVENTION

Figure 4A:
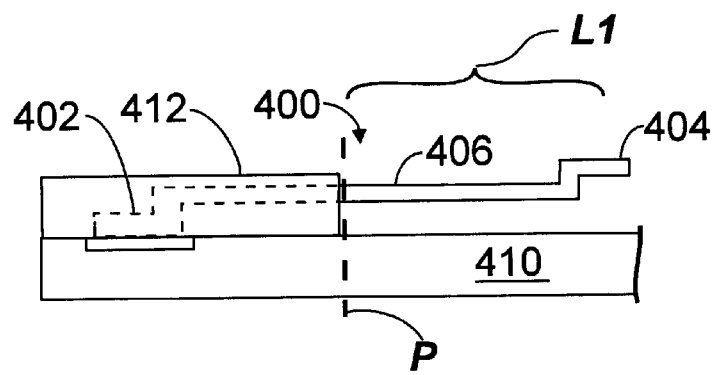
FIGS. 4A–4B are side cross-sectional views illustrating techniques applicable to uniformizing an effective length of a plurality of spring contact elements, according to the invention.
Figure 4B:
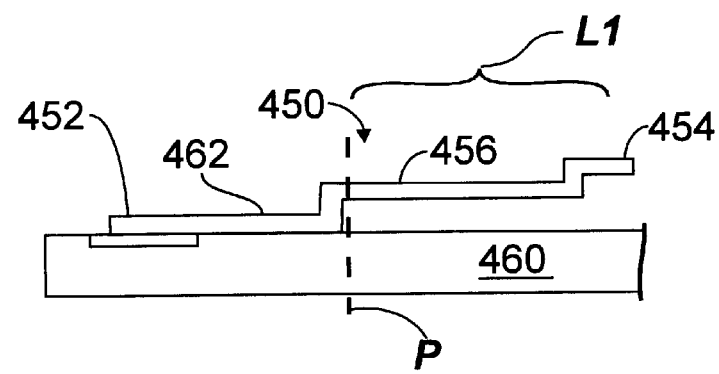

Commonly-owned, copending U.S. Provisional Patent Application No. 60/030,697 filed Nov. 13, 1996 discloses, for example at FIGS. 4A–4C thereof, a technique for fabricating free-standing resilient (spring) contact elements on an electronic component. Generally, a number of insulating layers having openings formed therein are aligned and "seeded" with a layer of conductive material. A mass of conductive material can then be formed (or deposited) in the seeded opening(s), such as by electroplating (or CVD, sputtering, electroless plating, etc.). After the insulating layers are removed, the masses can function as free-standing resilient contact structures which extend not only vertically above the surface of the component, but also laterally from the location whereat they are mounted. In this manner, the contact structures are readily engineered to be compliant in both the Z-axis as well as in the x-y plane (parallel to the surface of the component). This is described in greater detail hereinbelow with respect to FIGS. 1A–1C.

Figure 1A:
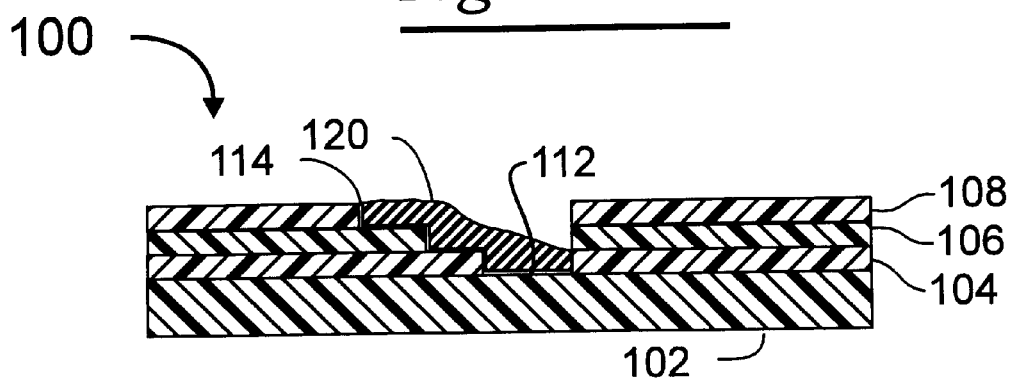
FIG. 1A is a side cross-sectional view of a technique for making a spring contact element, according to the invention.

FIG. 1A illustrates an exemplary technique 100 for fabricating one of a plurality of free-standing resilient (spring) contact elements on a substrate 102 which may be an active electronic component, including semiconductor devices, including semiconductor devices resident on a semiconductor wafer (not shown).

The substrate 102 has a plurality (one of may shown) or areas 112 on its surface whereat the spring contact elements will be fabricated. In the case of the substrate 102 being an electronic component (such as a semiconductor device), these areas 112 would be terminals (such as bond pads) of the electronic component.

Generally, the technique 100 involves applying a number (three shown) of patterned masking layers 104, 106 and 108 having openings onto the surface of the substrate. The layers are patterned to have openings (as shown) aligned with the areas 112, and the openings are sized and shaped so that an opening in a one layer (e.g., 108, 106) extends further from the area 112 than an opening in an underlying layer (e.g., 106, 104, respectively). In other words, the first layer 104 has an opening which is directly over the area 112. A portion of the opening in the second layer 106 is aligned over at least a portion of the opening in the first layer 104 and, conversely, a portion of the first layer 104 extends under a portion of the opening in the second layer 106. Similarly, a portion of the opening in the third layer 108 is aligned over at least a portion of the opening in the second layer 106 and, conversely, a portion of the second layer 106 extends under a portion of the opening in the third layer 108. The bottom portion of a given overall opening is directly over the selected area 112 and its top portion is elevated and laterally offset from its bottom portion. As will be discussed in greater detail hereinbelow, a conductive metallic material is deposited into the openings, and the masking layers are removed, resulting in a free-standing contact structure having been fabricated directly upon the substrate with its base end secured to the substrate 102 at the area 112 and its free end extending both above the surface of the substrate and laterally-displaced from the area 112.

If required, such as for electroplating, a very thin (e.g., 450 nanometers) "seed" layer of conductive material 114 such as titanium/tungsten (TiW) may be deposited into the openings. Then, a mass of conductive metallic material (e.g., nickel) 120 can be deposited by electroplating into the openings.

Figure 1B:
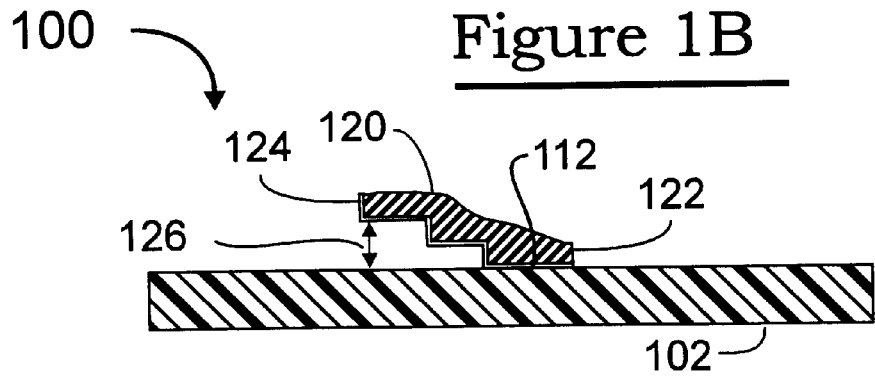
FIG. 1B is a side cross-sectional view of the spring contact element of FIG. 1A, according to the invention.
Figure 1C:
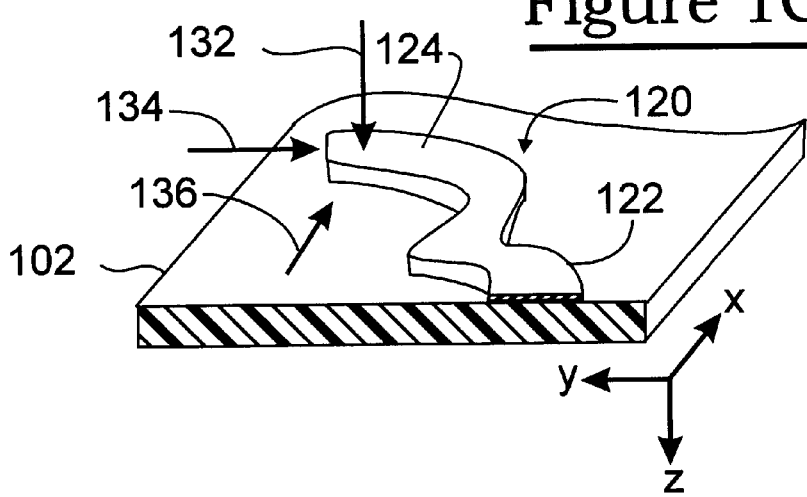
FIG. 1C is a perspective view of the spring contact element of FIG. 1B, according to the invention.

FIGS. 1B and 1C illustrate a resulting spring contact element 120 having its base end 122 adjacent the area 112, and its free-end (tip) 124 elevated in the z-axis above the surface of the substrate 102 as well as laterally offset in the x-axis and y-axis from the base end 122.

As best viewed in FIG. 1C, the contact element will react pressure applied in the z-axis at its tip end 124, as indicated by the arrow 124, such as would result from making a temporary pressure electrical connection with a terminal (not shown) of another electronic component (not shown). Compliance in the z-axis ensures that contact force (pressure) will be maintained, and also accommodates non-planarities (if any) between terminals (not shown) on the other electronic component (not shown). Such temporary electrical connections are useful for making temporary connections to the electronic component 102, such as for performing burn-in and/or testing of the component 102.

The tip end 124 is also free to move compliantly in the x- and y-directions, as indicated by the arrows 136 and 134, respectively. This would be important in the context of joining (by soldering, or brazing, or with a conductive adhesive) the tip end 124 to a terminal (not shown) of another electronic component (not shown) which has a different coefficient of thermal expansion than the substrate (component) 102. Such permanent electrical connections are useful for assemblies of electronic components, such as a plurality of memory chips (each of which is represented by the substrate 102) to another electronic component such as an interconnection substrate such as a printed circuit board ("PCB"; not shown).

By suitable choice of material and geometry, these fabricated masses 120 can function as free-standing resilient contact structures which have been fabricated with very precise dimensions and very precise spacings from one another. For example, tens of thousands of such spring contact elements (120) are readily precisely fabricated on a corresponding number of terminals on semiconductor devices which are resident on a semiconductor wafer (not shown).

In this manner, there has been shown a method of fabricating spring contact elements (120) directly on a substrate (102) such as an electronic component, such as a semiconductor device which may be resident on a semiconductor wafer, by applying at least one layer of masking material (104, 106, 108) on a surface of the substrate (102) and patterning the masking layer to have openings extending from areas (112) on the substrate to positions which are spaced above the surface of the substrate and which also are laterally and/or transversely offset from the areas 112); by optionally seeding (114) the openings; by depositing at least one layer of a conductive metallic material into the openings; and by removing the masking material so that the remaining conductive metallic material forms free-standing contact elements extending from the surface of the substrate, each contact element having a base end which is secured to a one of the areas of the substrate and having a tip end for making an electrical connection to a terminal of an electronic component.

Materials

The structures (spring contact elements) 120 are principally, preferably entirely, metallic, and may be formed (fabricated) as multilayer structures. Suitable materials for the one or more layers of the contact structures include but are not limited to:

nickel, and its alloys;

copper, cobalt, iron, and their alloys;

gold (especially hard gold) and silver, both of which exhibit excellent current-carrying capabilities and good contact resistivity characteristics;

elements of the platinum group;

noble metals;

semi-noble metals and their alloys, particularly elements of the palladium group and their alloys; and tungsten, molybdenum and other refractory metals and their alloys.

In cases where a solder-like finish is desired, tin, lead, bismuth, indium and their alloys can also be used.

An Exemplary Application (Use) for the Spring Contact Elements

As mentioned above, the spring contact elements (120) of the present invention are useful for effecting temporary electrical connections to the component (102) upon which the spring contact elements are fabricated, such as for burning-in and/or testing the components. Commonly-owned, copending U.S. patent application Ser. No. 08/784,862 filed Jan. 15, 1997 discloses at FIG. 1A thereof, reproduced herein as FIG. 2A, a system for performing wafer-level burn-in and test.

Figure 2A:
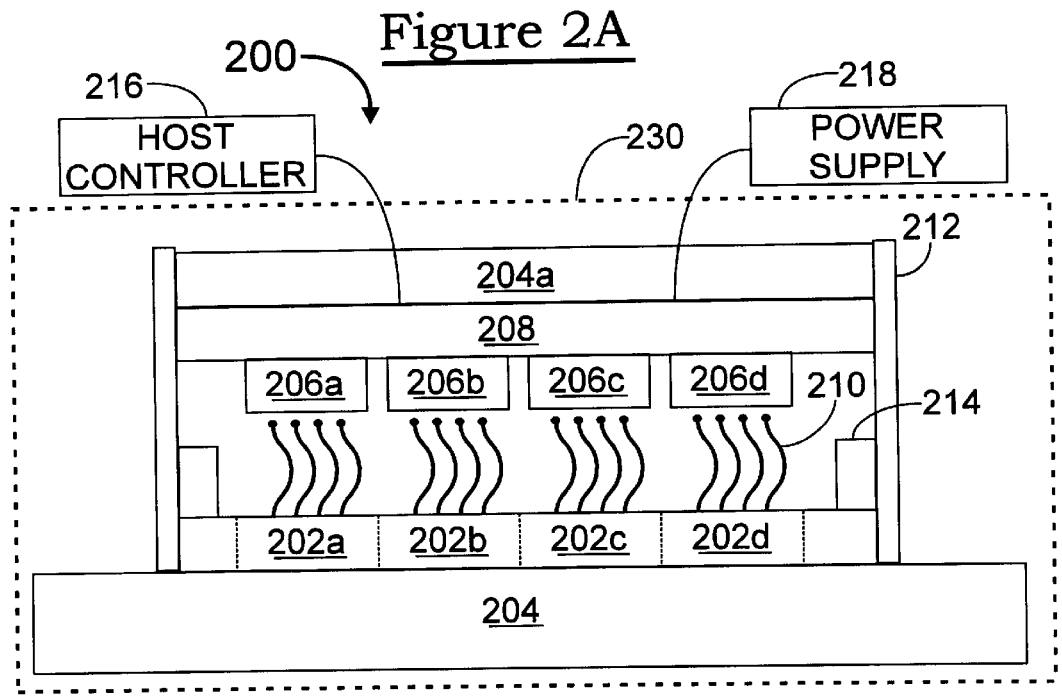
FIG. 2A is a schematic illustration of a system application for spring contact elements on semiconductor devices, according to the invention.

FIG. 2A illustrates an exemplary system 200 for performing wafer-level burn-in and test of a plurality of semiconductor devices 200 (200a, 200b, 200c, 200d) resident on a semiconductor wafer. Spring contact elements 210 (compare 120) are fabricated on each of the semiconductor devices, and are illustrated in a highly schematic manner. Each device is shown having four of many such spring contact elements projecting (schematically) from its surface. The entire semiconductor wafer is suitably mounted on a thermally-controlled platen 204.

A test substrate includes an interconnection substrate 208 having a plurality of active electronic devices 206 (206a, 206b, 206c, 206d) mounted on its front surface. These devices are suitably application-specific integrated circuits (ASICs). A thermally-controlled platen 204a may be mounted to the back side of the interconnection substrate 208. The ASICs 206 are connected to the interconnection substrate 208 in any suitable manner, such as by bond wires (not shown). A host computer 216 and a power supply 218 are connected to the ASICs via the interconnection substrate 208. Suitable fixturing 212, 214 is provided so that the wafer (202) may be aligned and moved towards the interconnection substrate (208) until the spring contact elements 210 effect pressure connections with terminals on the front (bottom, as viewed) faces of the ASICs (206), whereupon the semiconductor devices (202) can be powered up, burned-in and tested, including simultaneously exercising all of the devices (202) on the wafer.

Figure 2B:
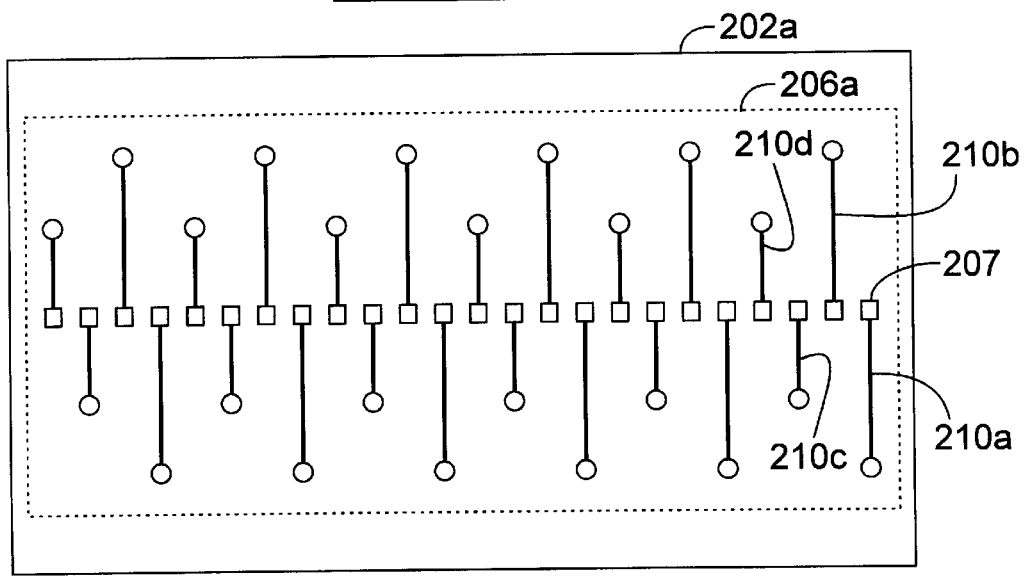
FIG. 2B is a schematic plan view of a portion of the system of FIG. 2A.

FIG. 2B, corresponding to FIG. 1B of commonly-owned, copending U.S. patent application Ser. No. 08/784,862 is a schematic illustration of a single one of the semiconductor devices 202a in contact with a corresponding single one of the ASICs 206a, and illustrates schematically that the spring contact elements (210) can be fabricated so that some of them (210a, 210b) are relatively long and others of them (210c, 210d) are relatively short, and so that some of them (210a, 210c) extend in a one direction from a central row of bond pads 207 (shown as squares) and others of them (210b, 210d) extend in an opposite direction from the central row of bond pads 207 so that the tip ends (shown as circles) of the spring contact elements are at a greater pitch (distance from one another) than their base ends.

Sizing and Shaping the Spring Contact Elements

Inasmuch as the spring contact elements of the present invention are suitably formed using micromachining techniques such as photolithography and plating, both the shape and size of the spring contact elements are readily controlled to precise dimensions.

Figure 3A:
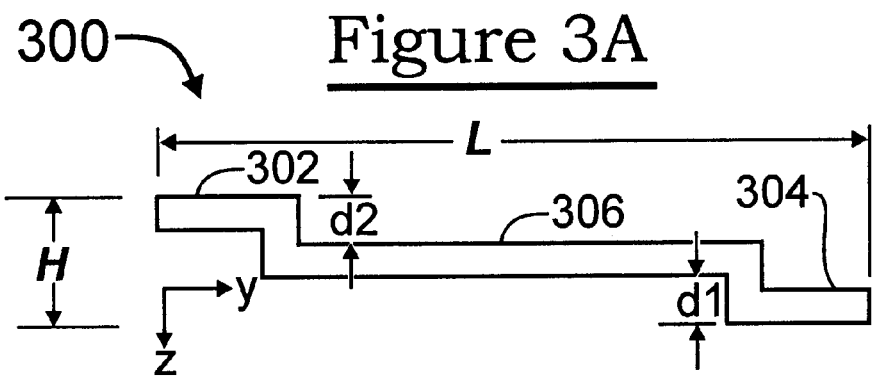
FIG. 3A is a side cross-sectional view of an alternate embodiment of a spring contact element, according to the invention.
Figure 3B:
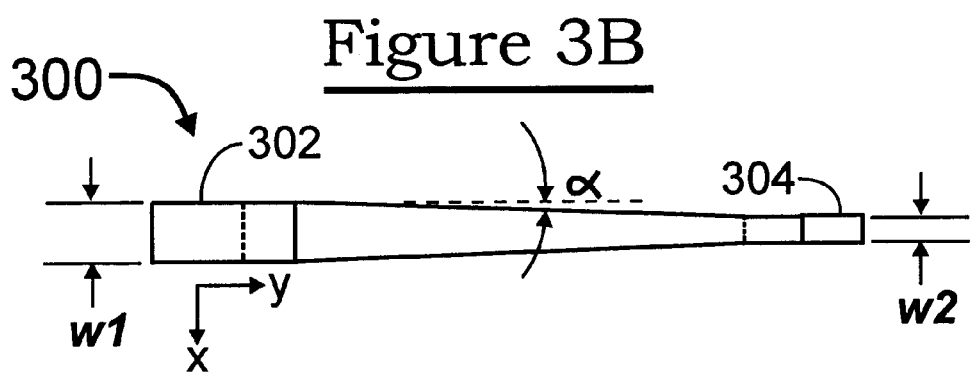
FIG. 3B is a plan view of the spring contact element of FIG. 3A, according to the invention.
Figure 3C:
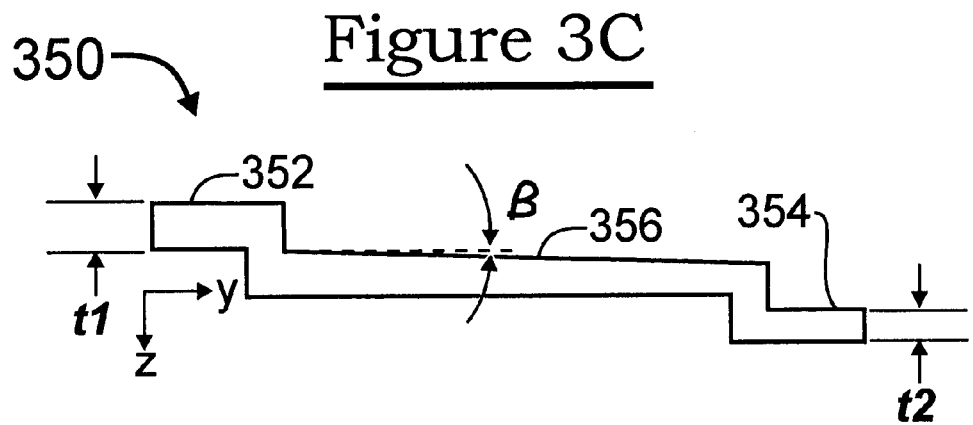
FIG. 3C is a side cross-sectional view of an alternate embodiment of a spring contact element, according to the invention.

FIGS. 3A–3C are schematic illustrations of spring contact elements 300 and 350 (compare 120) fabricated according to the techniques of the present invention.

The spring contact element 300 of FIGS. 3A and 3B have a base end portion 302, a contact (tip) end portion 304, a main body portion 306 therebetween, an overall length "L" and an overall height "H". As illustrated, the main body portion 306 is offset a distance "d2" in a one direction from the base end portion 302, and is offset a distance "d1" in another direction from the contact end portion 304. For example, the distance "d2" would be determined by the thickness of a first masking layer (compare 104) and the distance "d1" would be determined by the thickness of a final masking layer (compare 108). As best viewed in the top schematic view of FIG. 3B, the contact element 300 can be tapered provided with a widthwise taper "α" so that it is narrower (width "w1") at its contact end 304 than at its base end 302 (width "w2").

FIG. 3C is a schematic representation of a similar (to the contact element 300) spring contact element 350 that has a base end portion 352 (compare 302), a contact (tip) end portion 354 (compare 304), and a main body portion 356 (compare 306) therebetween. In this example, the contact element 350 can be tapered provided with a thickness taper "β" so that it is thinner (thickness "t2") at its contact end 304 than at its base end 302 (thickness "t1").

Exemplary Dimensions

The spring contact elements of the present invention are particularly well suited to making interconnections between microelectronic components. Using the parameters set forth hereinabove, suitable dimensions for the spring contact element are (in mils, unless otherwise specified):

| dimension | range | preferred |
|---|---|---|
| L | 10–1000 | 60–100 |
| H | 4–40 | 5–12 |
| d1 | 3–15 | 7 ± 1 |
| d2 | 0–15 | 7 ± 1 |
| w1 | 3–20 | 8–12 |
| w2 | 1–10 | 2–8 |
| t1 | 1–10 | 2–5 |
| t2 | 1–10 | 1–5 |
| α | 0–30° | 2–6° |
| β | 0–30° | 0–6° |

Tailoring the Behavior of the Spring Contact Elements

The possibilities of having spring contact elements of different lengths than one another has been discussed hereinabove (see, e.g., FIG. 2B). In order that a plurality of different length spring contact elements resident on a single electronic component all exhibit the same spring constant (k), it is possible, but not preferred, to "customize" the taper angles for each contact element in the manner discussed with respect to FIGS. 3B and 3C. Another, more facile way to uniformize the spring constants of different length spring contact elements is described with respect to FIGS. 4A and 4B.

In either case, namely whether the base end (302) is wider (FIG. 3B) than the tip end (304), or the base end (352) is thicker (FIG. 3C) than the tip end (354), the base end (302, 352) has a larger cross-section than the tip end (304, 354).

FIG. 4A illustrates a spring contact element 400 which has been fabricated on an electronic component 410. The spring contact element 400 has a base end 402 (compare 302), a contact end 404 (compare 304), a main body portion 406 (compare 306), and an overall length (L) between the base end and the contact end. In order to make the spring contact element 400 "behave" as though it were shorter (e.g., to exhibit behavior similar to shorter spring contact elements on the same component) the base end 402 and a contiguous portion of the main body portion 406 are encapsulated with a suitable encapsulant (e.g., epoxy) to "rigidize" the spring contact element up to a point "P" which is located a distance "L1" from the contact end 404 along the body portion 406.

FIG. 4B illustrates another technique for tailoring the mechanical performance of a spring contact element 450 (compare 400) which has been fabricated on an electronic component 460 (compare 410). The spring contact element 450 has a base end 452 (compare 402), a contact end 454 (compare 404), a main body portion 456 (compare 406), and an overall length (L) between the base end and the contact end. In order to make the spring contact element 450 "behave" as though it were shorter (e.g., to exhibit behavior similar to shorter spring contact elements on the same component) a portion of the main body portion 456 which is contiguous with the base end 452 "follows" the surface of the component 460 to a point "P" whereat it "steps up" so that it is elevated above the surface of the component. As in the previous example (400), the point "P" is located a distance "L1" from the contact end 454 along the body portion 456.

The portion of the spring contact element 450 that "follows" along the surface of the component 460 is the "tail" end 462 of the spring contact element 450. Aside from employing this technique (FIG. 4B) to uniformize spring constant, it within the scope of this invention that the tail ends of the spring contact elements formed according to the invention extend in any direction along the surface of the component (460) to effect "routing" from a given terminal on the component. In this manner, for example, a peripheral array of component terminals can be transformed to an area array of tips (454), and vice-versa. It is also within the scope of this invention that the "tails" (462) of two or more spring contact elements (450) can cross over one another to facilitate more complex routing schemes. Reference is also made to FIG. 3D of the aforementioned PCT/US95/14885, which discusses a form of routing in conjunction with spring contact elements.

Another Embodiment

As is evident, a great degree of control can be exerted in the size, shape and orientation of the spring contact elements fabricated according to the present invention.

Figure 5:
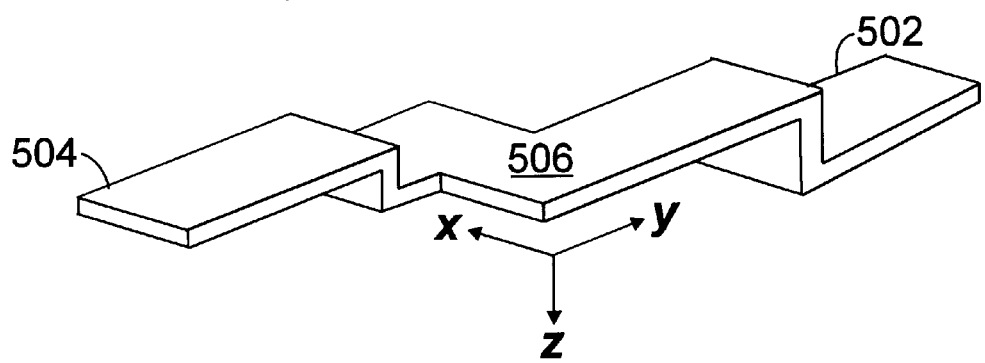
FIG. 5 is a perspective view of an alternate embodiment of a spring contact element, according to the invention.

FIG. 5 illustrates a spring contact element (compare 120) having a base end 502, a contact end 504, and a body portion 506 therebetween. In this example, the body portion "jogs" in the x-y plane (parallel to the surface of the component upon which it is fabricated) so that the contact end 504 is at different x, y and z coordinates than the base end 502. In other words, as the body portion 506 traverses the y-axis, it shifts (jogs) in the x-axis.

Controlled Impedance

For use in probing semiconductor devices, particularly for performing at-speed testing, it is advantageous that the spring contact element have controlled impedance.

Figure 6A:
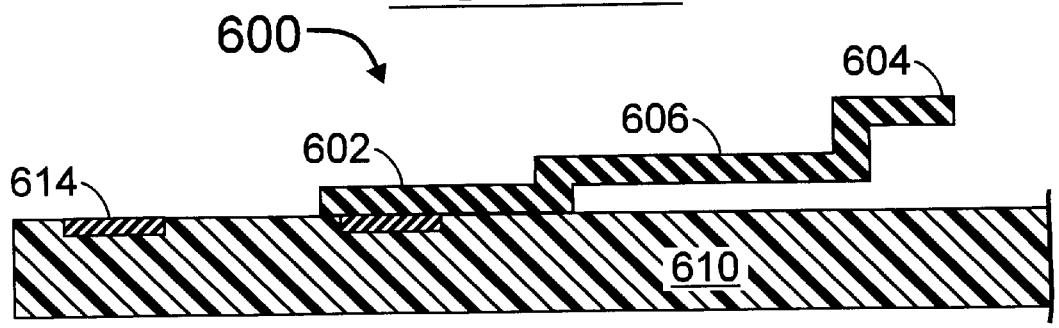
FIG. 6A is a side cross-sectional view of a first step in a technique for achieving controlled impedance in a spring contact element, according to the invention.
Figure 6B:
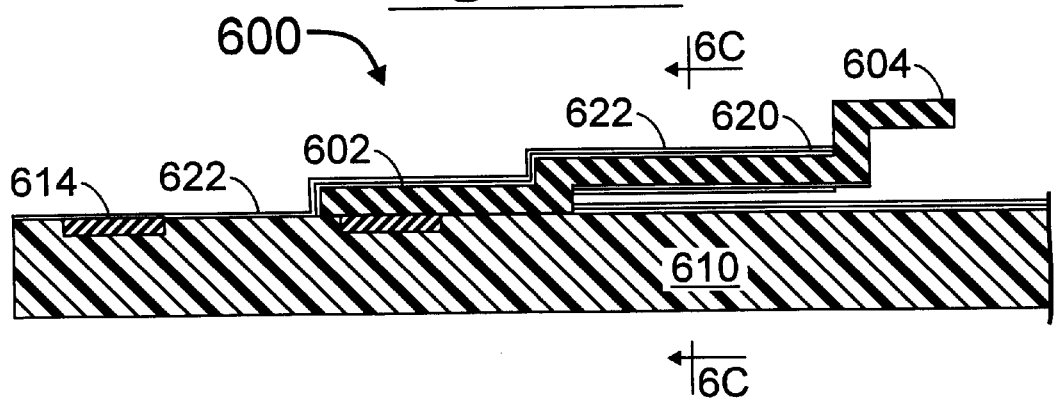
FIG. 6B is a side cross-sectional view of a next step in the technique for achieving controlled impedance in a spring contact element, according to the invention.
Figure 6C:
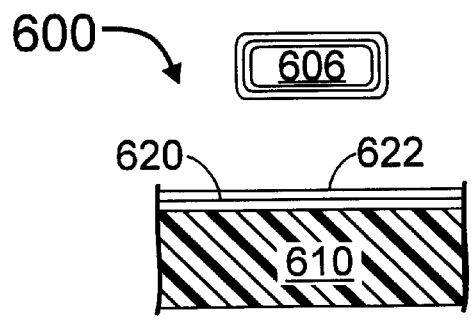
FIG. 6C is an end cross-sectional view of the controlled impedance spring contact element of FIG. 6B, according to the invention.

FIGS. 6A–6C illustrate a technique 600 for achieving controlled impedance in a spring contact element, according to the invention.

In a first step, best viewed in FIG. 6A, a spring contact element 600 (compare 400) is mounted by its base end 602 (compare 402) to a terminal 612 of an electronic component 610 (compare 410). The contact tip end 604 (compare 404) is elevated above the surface of the component 610. The spring contact structure has a central body portion 606 (compare 406) between its base and tip ends.

In a next step, best viewed in FIG. 6B, the tip end 604 of the spring contact element is masked (not shown), and a suitable thin (e.g., 1–10 μm) insulating layer 620, such as parylene, is deposited, such as by vapor deposition, onto all but the tip end 604 of the spring contact element, and adjacent surface of the electronic component.

In a next step, best viewed in FIG. 6B, while the tip end 604 of the spring contact element is still masked (not shown), a suitable thin (e.g., less than 0.25 mm) layer 622 of conductive material, such as any of the conductive metal material described herein, is deposited, such as by sputtering, onto all but the tip end 604 of the spring contact element, and adjacent surface of the electronic component. Finally, the tip end 604 is unmasked. This results in the central body portion 606 of the spring contact element being enveloped by a conductive layer 622, with an insulating layer 620 therebetween.

The conductive layer 622 is suitably connected to ground to function as a ground plane and control the impedance of the resulting spring contact element. For example, as best viewed in FIG. 6B, the component 610 is provided with a second terminal 614 which is electrical ground. This terminal 614 is suitably masked along with the tip end 604 of the spring contact element prior to applying the insulating layer 620, so that the subsequent conductive layer 622 will also deposit thereon and be connected thereto.

Evidently, this thicknesses of the layers 620 and 622 need only be sufficient to be continuous, and to provide the sought after controlled impedance, and should not be so thick as to interfere with the mechanical operation of the spring contact element. The representations in FIGS. 6B and 6C are not drawn to scale.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, the resulting spring contact elements may be heat-treated to enhance their mechanical characteristics. Also, any heat incident to permanently connecting (e.g., by brazing) the spring contact elements to a component can advantageously be employed to "heat treat" the material of the spring contact element.

What is claimed is:

1. A method of fabricating spring contact elements on a substrate, comprising:

applying at least one layer of masking material on a surface of a substrate and patterning the masking layer to have openings extending from areas on the substrate to positions which are above the surface of the substrate and which also are laterally and/or transversely offset from the areas;

depositing a first conductive material, the conductive material comprising a metallic material into the openings, delimiting defined areas of the first conductive material, selectively depositing a second conductive material substantially over the defined areas of the first conductive material, depositing the second conductive material in sufficient thickness to impart useful resilience to a free standing contact element, and removing the masking material so that the remaining second conductive material and the first conductive material forms free-standing contact elements extending from the surface of the substrate, each contact element having a base end which is secured to a one of the areas of the substrate and having a free-standing end and delimiting the defined areas so that for each free-standing contact element, the base end has a larger cross-section than the free-standing end of the contact element.

2. Method, according to claim 1, wherein:

the substrate is an electronic component.

3. Method, according to claim 1, wherein:

the substrate is a semiconductor device.

4. Method, according to claim 1, wherein:

the substrate is a semiconductor wafer.

5. A method of making a resilient contact structure, the method comprising providing an electronic component with a surface and a terminal near the surface, depositing a first masking layer on the electronic component with an opening near the terminal, depositing a first conductive layer of conductive material (a) over at least a portion of the terminal to form a first region of the first conductive layer and (b) over at least a portion of the first masking layer to form a second region of the first conductive layer, connecting the first region and second region with a third region of the first conductive layer, depositing a second masking layer with an opening in the second masking layer that overlaps at least in part the opening in the first masking layer, delimiting a defined area of the first conductive layer, the defined area including at least a portion of the opening near the terminal, and later selectively depositing a second conductive material substantially over the defined area of the first conductive layer, depositing the second conductive material in sufficient thickness to impart useful resilience to a resilient contact element, to form a resilient contact structure electrically connected to the terminal.

6. The method of claim 5 further comprising:

before depositing the first masking layer, depositing an initial conductive layer of conductive material over at least a portion of the electronic component and over at least a portion of the terminal, then depositing the first masking layer over at least a portion of the initial conductive layer.

7. The method of claim 5 further comprising removing the first masking layer to free the resulting resilient contact structure.

8. The method of claim 5 wherein the second region of the first conductive layer is approximately parallel to and displaced from the surface of the electronic component.

9. The method of claim 5 wherein the opening in the first masking layer includes an area on the surface of the electronic component, which may include some or all of the terminal, sufficient to secure the ultimate resilient contact structure.

10. The method of claim 5 wherein the first masking layer comprises a photoresist material.

11. The method of claim 5 wherein the first conductive layer has a thickness of about 450 nanometers.

12. The method of claim 5 wherein the first conductive layer comprises an alloy of titanium and tungsten.

13. The method of claim 5 wherein the seed layer comprises an alloy of titanium and tungsten with a thickness of about 450 nanometers.

14. The method of claim 5 wherein the first conductive layer is deposited by a process selected from the group consisting of sputtering, chemical vapor deposition, physical deposition, and e-beam deposition.

15. The method of claim 5 wherein the first conductive layer is deposited by electrolytic plating.

16. The method of claim 5 wherein the first conductive layer is deposited by a process selected from the group consisting of electrolytic plating, electroless plating, chemical vapor deposition, physical vapor deposition, a process involving the deposition of material out of aqueous solution, and a process causing the deposition of material through induced disintegration of a precursor, liquid or solid.

17. The method of claim 5 wherein the resilient material comprises nickel.

18. The method of claim 5 wherein the resilient material comprises a material selected from the group consisting of nickel, copper, cobalt, iron, gold, silver, elements of the platinum group, noble metals, semi-noble metals, elements of the palladium group, tungsten, and molybdenum.

19. The method of claim 5 wherein the electronic component is a semiconductor device.

20. The method of claim 5 wherein the electronic component is a semiconductor device which has not been singulated from a wafer.

21. The method of claim 5 wherein the electronic component is selected from the group consisting of a semiconductor device, a memory device, a portion of a semiconductor wafer, a space transformer, a ceramic device, a probe card, a chip carrier and a socket.

* * * * *